(12) United States Patent
Schumacher

(10) Patent No.: US 7,005,955 B2
(45) Date of Patent: Feb. 28, 2006

(54) INDUCTOR OR TRANSFORMER HAVING A FERROMAGNETIC CORE THAT IS FORMED ON A PRINTED CIRCUIT BOARD

(75) Inventor: Richard A. Schumacher, Dallas, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 176 days.

(21) Appl. No.: 10/421,066

(22) Filed: Apr. 23, 2003

(65) Prior Publication Data

US 2004/0212475 A1 Oct. 28, 2004

(51) Int. Cl.
*H01F 5/00* (2006.01)
*H01F 27/24* (2006.01)
(52) U.S. Cl. ........................ 336/200; 336/234
(58) Field of Classification Search ............... 336/200, 336/234
See application file for complete search history.

(56) References Cited

U.S. PATENT DOCUMENTS

| 5,279,988 | A | 1/1994 | Saadat et al. |
| 5,528,205 | A | 6/1996 | Wong |
| 5,777,539 | A | 7/1998 | Folker et al. |
| 5,781,091 | A | 7/1998 | Krone et al. |
| 5,793,272 | A | 8/1998 | Burghartz et al. |
| 5,884,990 | A | 3/1999 | Burghartz et al. |
| 6,054,329 | A | 4/2000 | Burghartz et al. |
| 6,114,937 | A | 9/2000 | Burghartz et al. |
| 6,148,500 | A | 11/2000 | Krone et al. |
| 6,489,876 | B1 | 12/2002 | Jitaru |
| 6,493,861 | B1 | 12/2002 | Li et al. |
| 2003/0231093 | A1 * | 12/2003 | Hsu et al. ............... 336/200 |

OTHER PUBLICATIONS

Johnson, Howard, "Nickel-plated Traces," High-Speed Digital Design, On-Line Newsletter, vol. 5, Issue 6, p. 1-5, (2002).

* cited by examiner

Primary Examiner—Ramon M. Barrera

(57) ABSTRACT

One embodiment of the invention is an inductor that is formed on a printed circuit board comprising a core of ferromagnetic material that is formed on a layer of the printed circuit board, and a winding that surrounds a portion of the core and is formed from a plurality of vias in the printed circuit board.

11 Claims, 5 Drawing Sheets

INDUCTOR OR TRANSFORMER HAVING A FERROMAGNETIC CORE THAT IS FORMED ON A PRINTED CIRCUIT BOARD

FIELD OF THE INVENTION

This invention is related in general to inductors and/or transformers and in specific to an inductor or transformer with a ferromagnetic core that is formed on a printed circuit board.

DESCRIPTION OF THE RELATED ART

Inductors are electronic components that are used in many types of systems. Inductors typically comprise a winding or coil of wires that surrounds a central core of ferromagnetic material, e.g. iron, iron alloys, or composite materials (e.g. ferrites). Coreless inductors having low voltage-amp (VA) ratings are also known. Inductors with mutually coupled magnetic circuits are also known (e.g. transformers).

Inductors have been formed from single or multiple layers of printed circuit boards (PCBs) or printed wiring boards (PWBs). For example, Folker et al., U.S. Pat. No. 5,777,539, which is hereby incorporated herein by reference, describes an inductor that uses the multiple layers of the PCB to form the windings about a core that is inserted into the board. However, this approach requires additional assembly steps, e.g. the steps of boring a hole in the PCB and inserting the core. Moreover, there may be air gaps that reduce the performance of the inductor. Also, the inserted core protrudes from the board, which increases the size of the completed device and of the assemblies that incorporate the device.

Other inductors are formed using a pre-fabricated core that are embedded inside the PCB. For example, Krone et al. U.S. Pat. No. 6,148,500, which is hereby incorporated herein by reference, describes an inductor that is formed from an embedded core in a printed circuit board, which uses conductive through-holes and conductive layers to form the coil or winding around the core. However, this approach also requires additional assembly steps, e.g. the steps of boring a hole in the PCB and inserting the core.

BRIEF SUMMARY OF THE INVENTION

One embodiment of the invention is an inductor that is formed on a printed circuit board comprising a core of ferromagnetic material that is formed on a layer of the printed circuit board, and a winding that surrounds a portion of the core and is formed from a plurality of vias in the printed circuit board.

Another embodiment of the invention is a method for forming an inductor on a printed circuit board comprising depositing a layer of ferromagnetic material onto a portion of the printed circuit board, forming a plurality of vias around a portion of the layer through the printed circuit board, forming a first connection trace on one side of the printed circuit board, and forming a second connection trace on another side of the printed circuit board, wherein the plurality of vias, the first connection trace, and the second connection trace form a coil around a portion of the layer.

A further embodiment of the invention is an inductor that is formed on a printed circuit board comprising a core that comprises an array of vias in the printed circuit board, wherein each via comprises a layer of ferromagnetic material, and a winding that surrounds a portion of the core and is formed from a trace in a plurality of layers of the printed circuit board.

A further embodiment of the invention is a method for forming an inductor on a printed circuit board comprising forming a coil through the plurality of layers of the printed circuit board that surrounds a portion of the printed circuit board, forming an array of a plurality of vias through the portion of the printed circuit board, and depositing a layer of ferromagnetic material onto the array of vias.

DETAILED DESCRIPTION

Embodiments of the invention involve the fabrication of ferromagnetic elements and/or magnetic circuits within printed circuit boards using existing fabrication techniques. Embodiments of the invention preferably form one or more inductors in a printed circuit board (PCB) or printed wiring board (PWB). Embodiments of the invention preferably use standard PCB fabrication techniques, e.g. deposition or plating, to form the one or more inductors. In one embodiment, the inductor comprises a core that has at least one layer of the PCB by forming a layer of ferromagnetic material. This embodiment preferably uses vias or conductive through-holes in combination with conductive layers or wires to form the winding around the core. The core may comprise a solid layer of ferromagnetic material. The core may also comprise alternating layers of ferromagnetic material and dielectric material. In an alternative embodiment, the core is formed from an array of vias that are coated with a ferromagnetic material, and the winding is formed from the layers of the printed circuit board. A preferred composition of the ferromagnetic material is nickel or a suitable alloy (e.g. ferromagnetic) thereof. Note that embodiments of the invention may be used to form a transformer, which comprises an inductor with at least two windings.

Inductors that are formed according to embodiments of the invention are preferably fabricated as part of the PCB. Thus, no additional assembly steps are required for making an inductor according to embodiments of the invention. Furthermore, an inductor made according to embodiments of the invention is simpler and/or less expensive to manufacture. Embodiments of the invention also form a more compact assembly since the inductor (e.g. the core) is built into the PCB. Furthermore, embodiments of the invention form an inductor that has less mass or weight and/or less bulk for a given voltage amperage (VA) rating. Since an inductor formed according to embodiments of the invention is integrated into the PCB, the inductor is more resistant to environmental extremes (e.g. vibration, shock, temperature). One or more inductors may be formed an a printed circuit board according to embodiments of the invention, whereby the printed circuit board (or a portion thereof) is incorporated into an electronic system. Also a plurality of inductors may be formed onto a printed circuit board according to embodiments of the invention, whereby the inductors are cut from the board and used as discreet components in one or more systems.

Figure 1A:
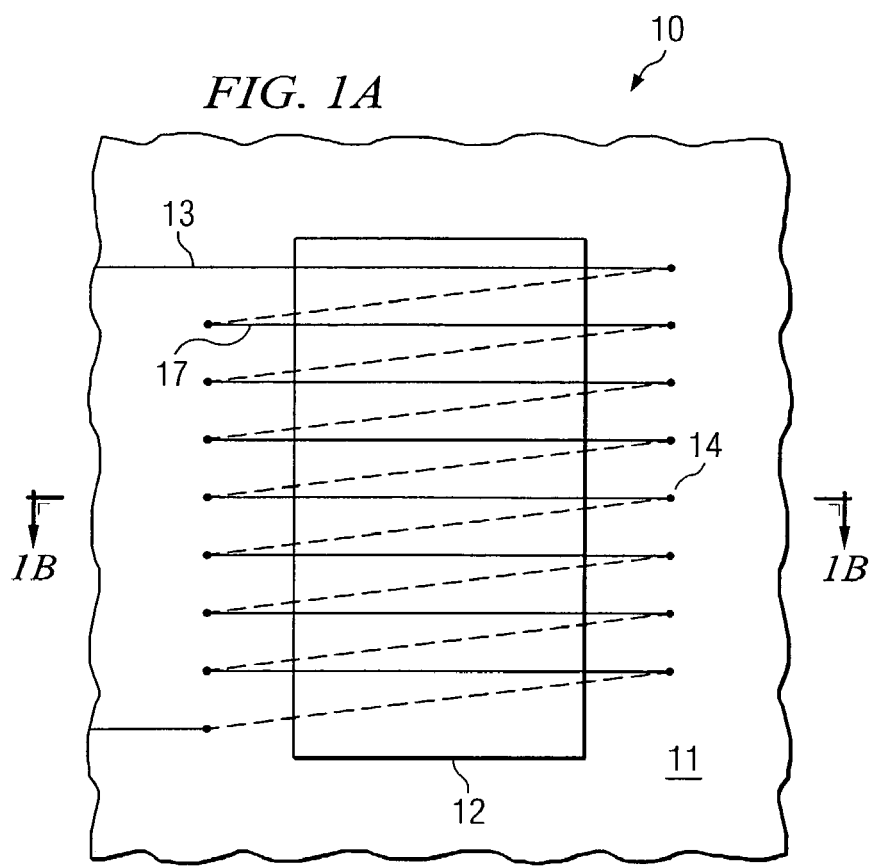
FIGS. 1A and 1B depict an inductor formed according to an embodiment of the invention.
Figure 1B:
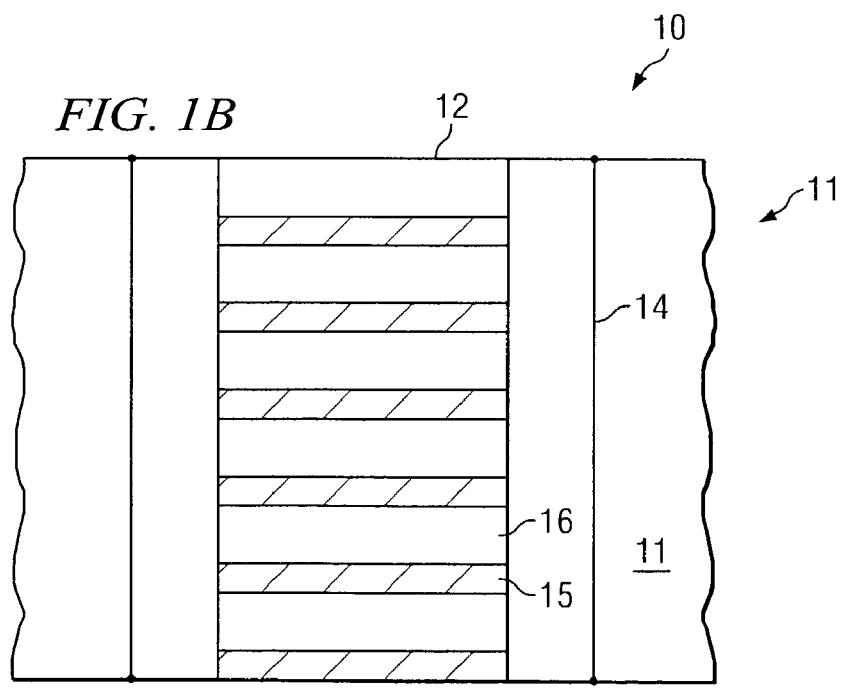

FIGS. 1A and 1B depict an inductor 10 formed according to an embodiment of the invention. FIG. 1A depicts a top down view of the inductor 10 in PCB board 11, and FIG. 1B depicts an enlarged sectional view of the inductor 10 of FIG. 1A. The inductor 10 includes core 12 and winding 17. The core 12 is preferably one or more layers of ferromagnetic material 16 that has been deposited onto the PCB board 11 through either chemical deposition or electroplating. Other conventional fabrication techniques used to manufacture PCB boards may also be used to deposit the layer for the core. The ferromagnetic material is preferably nickel, however an alloy containing nickel may be used so long as the alloy remains ferromagnetic. Other ferromagnetic materials may be used, especially if they may be deposited onto the PCB board according to known board fabrication techniques.

The winding is preferably formed from a plurality of vias 14. The vias 14 are formed according to known fabrication techniques. The vias 14 are sized and spaced around the core 12 for the desired current and/or voltage. Traces 13, or conductive paths, connect the vias 14 together to form the winding 17 around the core 12. The traces 13 are formed according to known fabrication techniques. Note that the number of vias is shown by way of example only, as more or fewer vias could be used. Also note that the pattern of the traces 13 is by way of example only as other traces could be used.

The magnetic core 12 may comprise a solid, relatively thick layer of ferromagnetic material. The core preferably comprises a plurality of layers of ferromagnetic material 15 with layers of dielectric material 16 located between the layers of ferromagnetic material 15. Each layer forms a gapless magnetic circuit. The dielectric material may be a ceramic or a polymer. The electrical isolation of each ferromagnetic layer 15 and/or the relative thinness of each layer 15 limits the formation of induced eddy currents which would otherwise create Ohmic heating and reduce the efficiency of the inductor 10. The number of layers 15 and their dimensions may be selected for a desired current and/or voltage. Note that the shape of the core is by way of example only as other shapes could be used, e.g. square or circular. Note that the number of layers 15 is shown by way of example only, as more or fewer layers could be used.

Figure 2A:
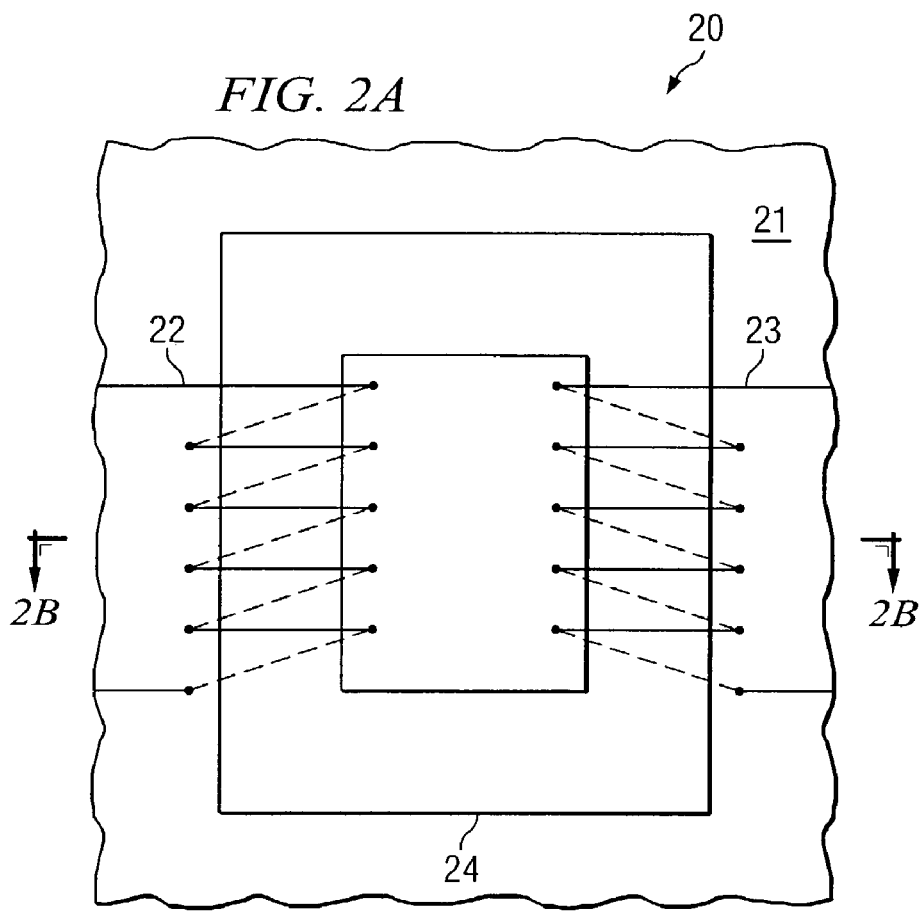
FIGS. 2A and 2B depict a transformer formed according to an embodiment of the invention.
Figure 2B:
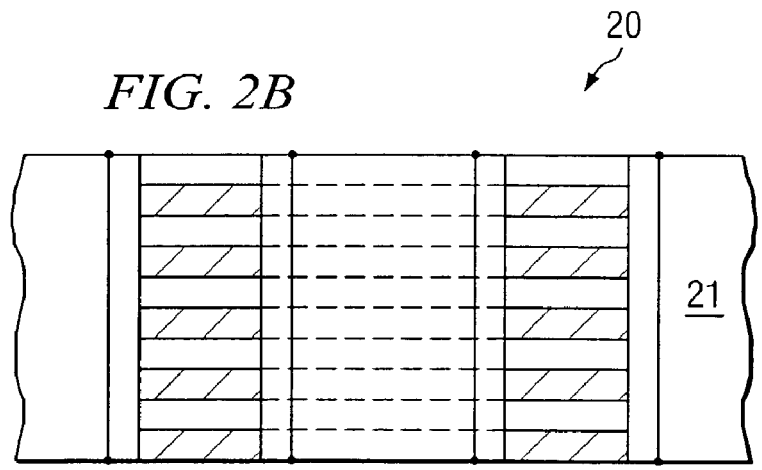

FIGS. 2A and 2B depict a transformer 20 formed according to an embodiment of the invention. FIG. 2A depicts a top down view of the transformer 20 in PCB board 21, and FIG. 2B depicts an enlarged sectional view of the transformer 20 of FIG. 2A. The transformer 20 comprises two windings 22, 23 and closed loop core (or magnetic circuit) 24. Transformer 20 could be formed using techniques similar to those used to form inductor 10 of FIGS. 1A and 1B. Note that the number of vias is shown by way of example only, as more or fewer vias could be used. Also note that the pattern of the traces is by way of example only as other traces could be used. Note that the shape of the core 24 is by way of example only as other shapes could be used, e.g. rectangular or circular. Note that the number of ferromagnetic layers is shown by way of example only, as more or fewer layers could be used. Further note that an auto-transformer, self-transformer, or isolation transformer may be similarly formed.

Figure 3A:
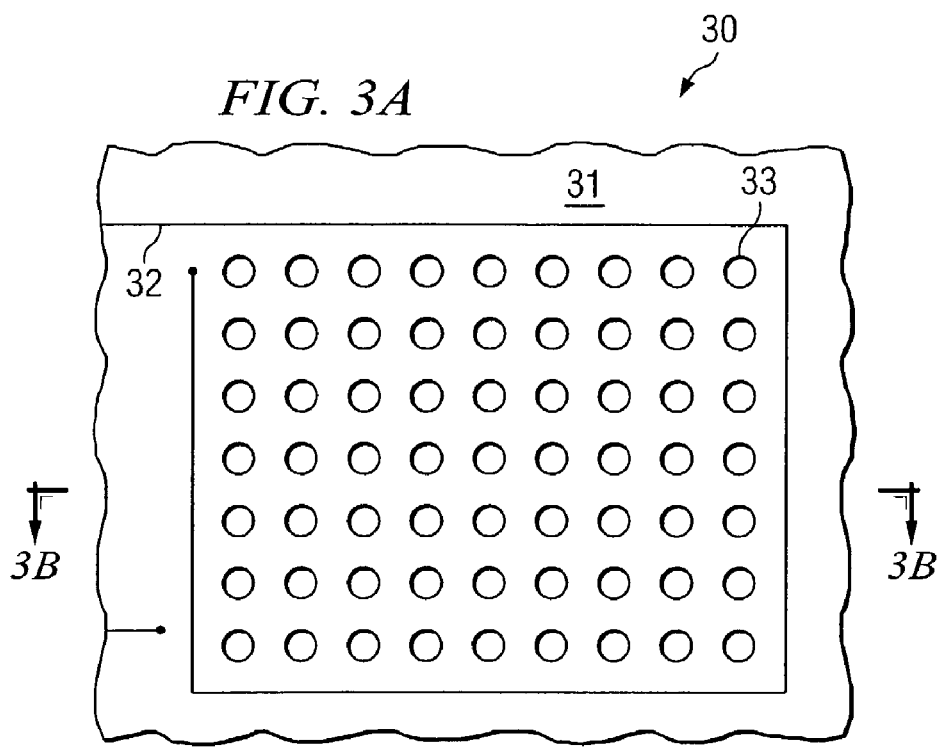
FIGS. 3A and 3B depict an inductor formed according to an embodiment of the invention.
Figure 3B:
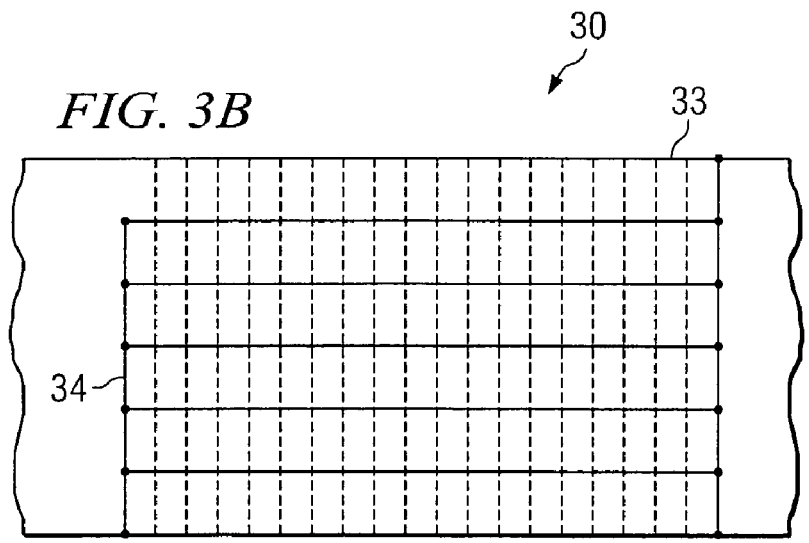

FIGS. 3A and 3B depict an inductor 30 formed according to an embodiment of the invention. FIG. 3A depicts a top down view of the inductor 30 in PCB board 31, and FIG. 3B depicts an enlarged sectional view of the inductor 30 of FIG. 3A. The inductor 30 includes core 33 and winding 32. The core 33 is preferably an array of vias. The size and spacing of the vias are selected for the desired current and/or voltage of the inductor 30. Each via is isolated from the other vias by the dielectric material of the board 31. The dielectric material may also be a ceramic or a polymer. The electrical isolation of each via and/or the relative thinness of each via, limits the formation of induced eddy currents which would otherwise create Ohmic heating and reduce the efficiency of the inductor 30.

Each via preferably includes a layer or coating of ferromagnetic material that has been deposited into the vias through either chemical deposition or electroplating. Other convention fabrication techniques used to manufacture PCB boards may also be used to deposit the layer in the vias. The ferromagnetic material is preferably nickel, however an alloy containing nickel may be used so long as the alloy remains ferromagnetic. Other ferromagnetic materials may be used, especially if they may be deposited onto the PCB board according to known board fabrication techniques.

The winding is preferably formed from a trace path that winds down through the layers of the PCB board 31. For example each layer may include a trace that surrounds a portion of the core. The different traces on the different layers may be connected by vias. The resulting trace path is a coil that surrounds the core 33. The traces and their connecting vias are formed according to known fabrication techniques. Note that the number of traces is shown by way of example only, as more or fewer traces could be used to form the trace path. Also note that the pattern of the traces 13 is by way of example only as other patterns could be used.

A transformer similar to that of FIGS. 2A and 2B could be formed using the inductor shown in FIGS. 3A and 3B. Note that an auto-transformer, self-transformer, or isolation transformer may be similarly formed.

Figure 4:
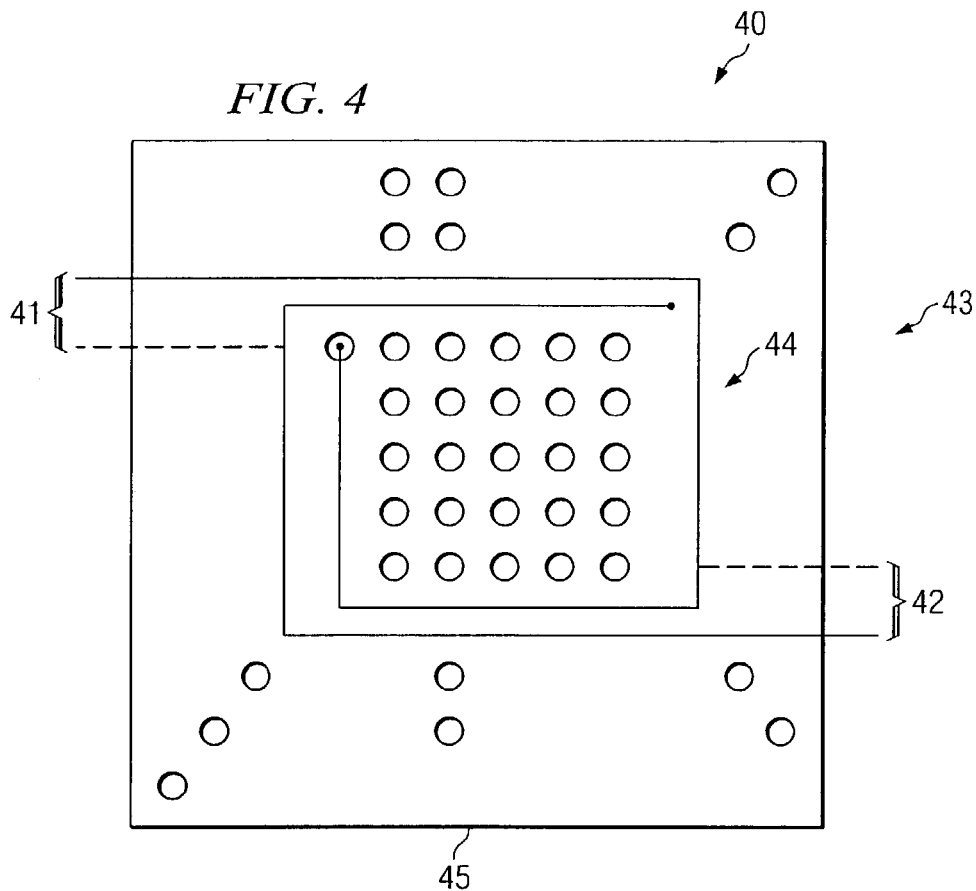
FIG. 4 depicts an example of a transformer formed in a PCB board according to an embodiment of the invention.

FIG. 4 depicts an example of a transformer 40 formed in PCB board 43 according to an embodiment of the invention. The transformer 40 comprises two windings 41, 42 and core 44. Transformer 40 could be formed using techniques similar to those used to form inductor 30 of FIGS. 3A and 3B. The transformer 40 includes magnetic shield 45. The shield 45 is fabricated from plating or depositing ferromagnetic material on layers that surround the transformer 40. The layers are connected with ferromagnetic coated vias so as to form one or more closed magnetic circuits that surround the device. The shield may be surface layers or sub-surface layers. The shield acts to reduce interference that may occur with another nearby device, e.g. another inductor or processor. Inductors may be similarly shielded. The ferromagnetic material is preferably nickel, however an alloy containing nickel may be used so long as the alloy remains ferromagnetic. Other ferromagnetic materials may be used.

Figure 5A:
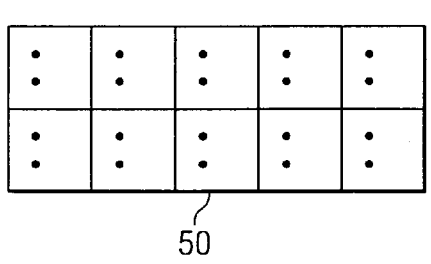
FIGS. 5A and 5B depict a board comprising discreet inductors, and a discreet inductor, respectively, according to an embodiment of the invention.
Figure 5B:
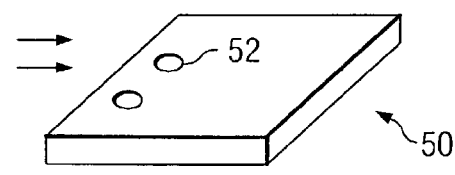

The inductors may be mass produced by using standard PCB fabrication techniques. For example, FIG. 5A depicts a PCB board 51 that comprises a plurality of inductors 50. The inductors 50 may be similar to inductor 10 or 30, or combinations thereof. Each inductor may have different VA ratings and/or other electrical characteristics. The board 51 would then be cut to produce a plurality of discreet inductors 50, as shown in FIG. 5B. Each discreet inductor would include a pair of connecting terminals 52. The inductors 50 may then be sold separately, and connected by consumers in their desired configurations.

Figure 6:
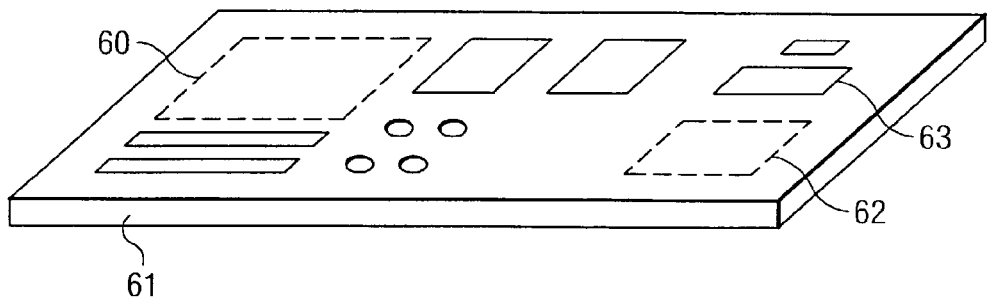
FIG. 6 depicts a PCB board with two inductors according to an embodiment of the invention.

The inductors may be formed on PCB boards that are going to be used in electronic systems. Each board may have a desired number of inductors, each of which may have different VA ratings and/or other electrical characteristics. The inductors may be placed where needed on the board. For example, FIG. 6 depicts a PCB board 61 that is to be used in a computer system, and includes two inductors 60, 62, and places to mount other components 63, e.g. memory chips, processor chip, etc.

Figure 7:
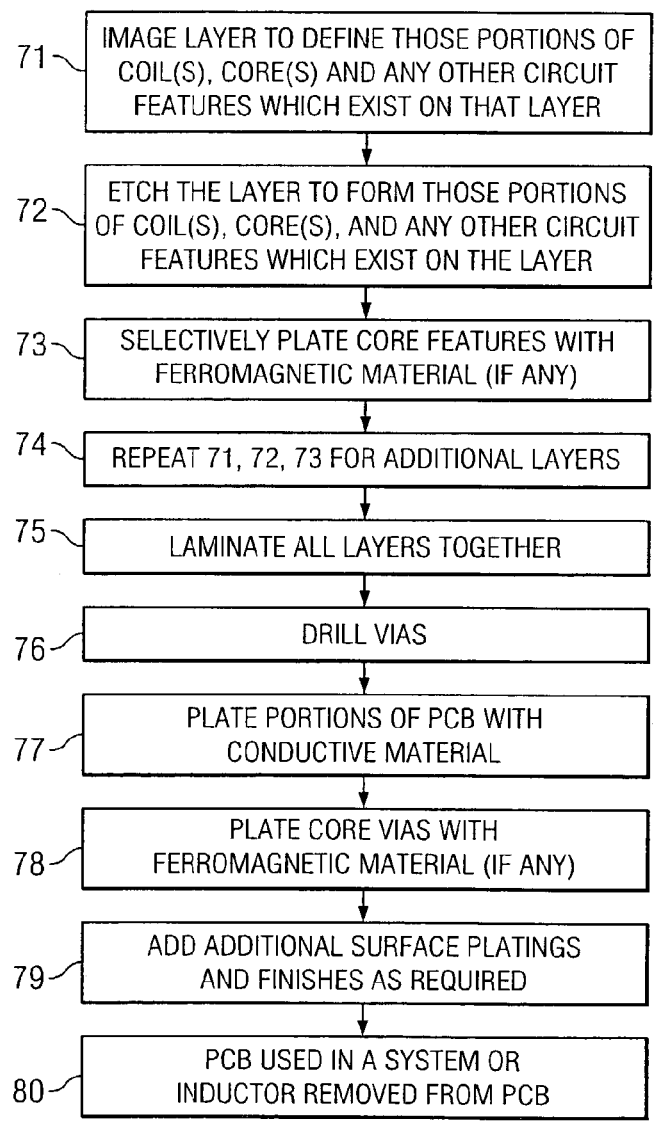
FIG. 7 depicts a flow chart of a method according to an embodiment of the invention.

FIG. 7 depicts a flow chart 70 for forming an inductor on a printed circuit board according to an embodiment of the invention, for example, the embodiment of FIGS. 1A and 1B, or the embodiment of FIGS. 3A and 3B. Note that a PCB is typically formed from a plurality of sub-boards that are laminated together. In box 71, the particular sub-board is imaged to define the features that will exist on that layer, including the portions of the coil and core that will comprise the inductor. In box 72, the sub-board is etched to form the features that will exist on that layer, including the portions of the coil and core that will comprise the inductor. In box 73, if the inductor is of the type embodied in FIGS. 1A and 1B, then a layer of ferromagnetic material, e.g. nickel or a nickel alloy, is deposited to comprise a portion of the core. In box 74, the steps of boxes 71, 72, and 73 are repeated to form additional sub-boards. Note that more than one sub-board may be formed at the same time. In box 75, the sub-boards are laminated together to form the PCB. In box 76, the vias are formed in the PCB, for example, by drilling. In box 77, portions of the PCB are plated with conductive material, e.g. copper, silver, gold, or other electrically conductive materials, to form electrical connections as needed, e.g. power distribution, data distribution, ground plane, etc. For example, as shown in FIG. 1A, the vias 14 would be plated, and the surface trace 17 that connects the vias would be formed. In box 78, if the inductor is of the type embodied in FIGS. 3A and 3B, then instead of (or in addition to) plating the core vias with conductive material, the core vias 33 are plated with a ferromagnetic material, e.g. nickel or a nickel alloy. In box 79, any additional activity is performed to complete the PCB, e.g. additional surface platings and/or finishes. In box 80, the inductor is removed from the PCB board, or the PCB (with the inductor) is used in a system.

What is claimed is:

1. An inductor that is formed on a printed circuit board comprising:
   a core of ferromagnetic material that is formed on a layer of the printed circuit board; and
   a winding that surrounds a portion of the core and is formed from a plurality of vias in the printed circuit board;
   wherein said core comprises a plurality of layers of ferromagnetic material; and
   wherein each layer is separated from an adjacent layer by a layer of dielectric material.

2. The inductor of claim 1, wherein the ferromagnetic material comprises nickel.

3. The inductor of claim 1 further comprising:
   another winding that surrounds a portion of the core and is formed from another plurality of vias in the printed circuit board;
   wherein the inductor is a transformer.

4. The inductor of claim 1 wherein at least a portion of the printed circuit board that has the inductor is used in an electronic system.

5. The inductor of claim 1, further comprising:
   a magnetic shield that is composed of a ferromagnetic material that reduces interference between the inductor and another device.

6. The inductor of claim 1, wherein the inductor is a transformer.

7. A method for forming an inductor on a printed circuit board comprising:
   depositing a core of ferromagnetic material onto a portion of the printed circuit board;
   forming a plurality of vias around a portion of the core through the printed circuit board;
   forming a first connection trace on one side of the printed circuit board; and
   forming a second connection trace on another side of the printed circuit board;
   wherein the plurality of vias, the first connection trace, and the second connection trace form a coil around a portion of the core;
   wherein said core comprises a plurality of layers of ferromagnetic material; and
   wherein each layer is separated from an adjacent layer by a layer of dielectric material.

8. The method of claim 7, wherein the method forms a plurality of inductors, the method further comprising:
   repeating the depositing a layer of ferromagnetic material, the forming a plurality of vias, the forming a first connection trace, and the forming a second connection trace to form the plurality of inductors on the printed circuit board.

9. The method of claim 8, further comprising:
   removing each inductor of the plurality of inductors from the printed circuit board to form a plurality of discreet inductors.

10. The method of claim 7, wherein the ferromagnetic material comprises nickel.

11. The method of claim 7, wherein the inductor is a transformer, the method further comprises:
    forming another plurality of vias around a portion of the layer through the printed circuit board;
    forming a third connection trace on one side of the printed circuit board; and
    forming a fourth connection trace on another side of the printed circuit board;
    wherein the another plurality of vias, the third connection trace, and the fourth connection trace form another coil around a portion of the layer.

* * * * *